(12) United States Patent
Stanton et al.

(10) Patent No.: US 9,182,212 B2
(45) Date of Patent: Nov. 10, 2015

(54) HALL EFFECT PROBE WITH EXCHANGEABLE WEAR TIPS

(71) Applicants: Matthew Edward Stanton, Reading, MA (US); Steven Abe LaBreck, Boston, MA (US)

(72) Inventors: Matthew Edward Stanton, Reading, MA (US); Steven Abe LaBreck, Boston, MA (US)

(73) Assignee: OLYMPUS NDT, INC., Waltham, MA (US)

( * ) Notice: Subject to any disclaimer, the term of this patent is extended or adjusted under 35 U.S.C. 154(b) by 486 days.

(21) Appl. No.: 13/671,024

(22) Filed: Nov. 7, 2012

(65) Prior Publication Data

US 2014/0125330 A1 May 8, 2014

(51) Int. Cl.
*G01B 7/06* (2006.01)
*H01L 21/66* (2006.01)

(52) U.S. Cl.
CPC .. *G01B 7/06* (2013.01); *G01B 7/10* (2013.01); *H01L 22/12* (2013.01)

(58) Field of Classification Search
CPC ................................. G01B 7/06; H01L 22/12
USPC ........................ 324/228–232, 754.29, 754.11
See application file for complete search history.

(56) References Cited

U.S. PATENT DOCUMENTS

| 5,191,286 | A | * | 3/1993 | Fischer | 324/230 |
| 5,539,675 | A | * | 7/1996 | Carroll, Sr. et al. | 702/170 |
| 5,691,636 | A | * | 11/1997 | Allshouse et al. | 324/207.15 |
| 5,828,212 | A | * | 10/1998 | Nix | 324/230 |
| 2007/0186434 | A1 | * | 8/2007 | Fischer | 33/834 |

OTHER PUBLICATIONS

N. Dubrovinskaia, S. Dub, and L. Dubrovinsky, Superior Wear Resistance of Aggregated Diamond Nanorods, *Nano Letters* 2006, vol. 6, No. 4, pp. 824-826.

* cited by examiner

*Primary Examiner* — Huy Q Phan
*Assistant Examiner* — Dustin Dickinson
(74) *Attorney, Agent, or Firm* — Ostrolenk Faber LLP

(57) ABSTRACT

Disclosed is a Hall sensor probe that configured to be coupled with one of a plurality of magnetic targets for measuring the thickness of a non-ferromagnetic wall. The probe comprises a magnetic field source, a Hall sensor, a concentrator and a main housing. The novel aspects of the probe include a wear tip that is exchangeably affixed onto the main-housing, leaving a permanent gap from and disjoined from the concentrator in a manner that transfers stress from the tip directly onto the main-housing. To serve every aspects of the primary objective, being it mechanical, thermal and operational, the material of the tip preferably has a fracture toughness higher than 20 MPa·m$^{1/2}$, wear coefficient higher than 100, and a magnetic susceptibility lower than 0.001.

21 Claims, 5 Drawing Sheets

HALL EFFECT PROBE WITH EXCHANGEABLE WEAR TIPS

FIELD OF THE INVENTION

The present invention relates to a thickness measurement device, more particularly to a Hall Effect probe assembly for measuring or inspecting thickness.

BACKGROUND OF THE INVENTION

Hall effect based electronic gauging is known to be used in thickness gauging. A typical Hall Effect probe deploys a magnetic field applied at right angles to a semiconductor element carrying a current. This combination includes a voltage in another direction perpendicular to the current flow and magnetic field. The magnetic circuit of the measurement system comprises a Hall sensor and a magnetic source such as magnets within a probe, and an external magnetic flux field. A ferromagnetic target such as a steel ball of known mass, placed in the magnetic circuit, alters the reluctance of the magnetic circuit, the magnetic flux density through the Hall sensor, and hence the induced voltage is changed. As the target is moved further away from the magnet, the magnetic reluctance is increased and hence the induced voltage is changed in a predictable manner. If these changes in the induced voltage are plotted, a curve can be generated which compares induced voltage to the distance of the target from the probe.

To make a measurement, a Hall sensor probe is simply placed on a first side of the test object, such as a blow-molding part, to be measured. A ferromagnetic target, frequently a small steel ball bearing, is placed opposite the probe on a second side of the test object. An electronic gauging instrument connected to the probe measures the probe voltage and displays the corresponding distance between the target and the probe tip, which is wall thickness. The target moves freely in all other dimensions except being drawn by the magnetic force of the Hall probe to stay aligned with the Hall probe on the opposite side of the wall of the test target.

A Hall probe is often favored for thickness gauging and quality checking for applications with non-magnetic test objects and thin walls such as molded plastic containers, automobile dashboard, fiber reinforced plastics and titanium castings.

Existing Hall probes have been seen in thickness gauge products, such as Magna-Mike 8600 by Olympus NDT. The Hall probes come in as one piece in an integral housing, including an un-exchangeable probe wear tip. Inside the housing, there's a magnet, a Hall sensor, electrical interconnections and a concentrator tip having high magnetic permeability and low magnetic remanence.

However, the existing Hall probes present some problems including an issue attributed to the unexchangeable probe tip, or wear tip. It is understandable that the tips of the Hall probes are often used to be slid over abrasive surfaces such as titanium castings and fiberglass layups, and are subject to wear. Probe tip wear changes the induced voltage to distance curve and the accuracy of thickness measurements compared to the original curve. Excessive wear can also damage the integrity of Hall sensor and electrical interconnections between the Hall sensor other electrical circuits. A tip damaged by other means such as impact from dropping or simply banning on the test object also changes the induced voltage and accuracy of thickness measurements. Damage or wear that degrades measurement accuracy or integrity of the probe requires expensive repair or replacement.

Another aspect of the problems presented by the existing probes involves direct force of the probe. The magnetic flux passing through a portion of the circuit comprising the Hall sensor and concentrator tip is dependent on the magnetic reluctance of the tip. The reluctance of the tip is reciprocally related to its magnetic permeability, a material characteristic that is a function of pressure and temperature. A force holding an object or a target on a tip that is opposed by an equal force extending through the concentrator exerts a pressure in the concentrator that can change the circuit reluctance and hence the induced voltage. Therefore any force exerted on the concentrator has an undesirable effect on the measurement accuracy.

Yet another factor affecting the measurement accuracy of existing Hall sensor probe relates to temperature variation within the existing probe. The induced output voltage of a Hall sensor is dependent on the input current, the flux passing through it, and the temperature. The flux passing through the Hall sensor is dependent on the temperature dependent reluctance of the concentrator tip. Heat transferred between an object or environment at one temperature and the outer surface of the tip at a second temperature will cause a change in the temperature of the tip. The heat flowing through the tip results in a temperature gradient throughout the tip. The temperature of a Hall sensor that is in intimate contact with an inner surface of the concentrator tip will change in response to temperature changes at that inner surface. Means for compensating temperature dependent output could be devised with on one or more discretely located temperature sensors that indicate localized conditions. However, in terms of transient thermal gradients within the magnetic circuit affecting measurement accuracy, it may be necessary to maintain physical contact until thermal equilibrium is achieved through the continuous volume of the concentrator. Therefore, it would be desirable that the probe's mechanical design functions to minimize the thermal gradients through the wear tip which can be minimized by increasing the thermal resistance and restricting heat flow through the probe.

Test object surfaces often include small radii or recessed contours preventing access of large probe tips to sharply curved surfaces. Test objects with severe contour restrictions such as automobile safety bag deployment tear seams require custom tip geometries.

Existing efforts have improved wear resistance of concentrator tips by a number of surface treatments or coatings, for example boride, nitride or carbide diffusion processes, or coating deposition by physical vapor deposition (PVD), chemical vapor deposition (CVD), plasma enhanced chemical vapor deposition (PECVD) among others that harden surfaces and reduce wear. The Borofuse Process™ is an example of a commercially available method of case hardening a variety of metals that has been used to substantially improve surface properties of concentrator tips. However, the improvement in wear life remains limited by the thinness of the surface treatment and the softness of the substrate concentrator material. Coatings do not protect the probe from impact damage and pressure or heat applied to a coated tip is readily transferred to the concentrator affecting tip permeability and Hall output voltage.

Another existing effort involves using hard, wear resistant caps made of ceramic or ceramic/metal composite material (cemented carbide) which are permanently adhered to concentrator tips to improve wear resistance. Ceramics offer superior wear resistance but ceramics are brittle and subject to fracture during impact. Cemented carbides offer improvement in fracture toughness relative to ceramics at the expense of lower wear resistance. Cemented carbides with a high cobalt content having moderately high magnetic permeability can serve as the concentrator and wear tip. Although wear is reduced by ceramic or cemented carbide tips relative to metal or coated metal tips, the tips have a finite wear life and present a series of other problems. For instance, probes with worn, permanently adhered wear tips may need expensive repair or replacement. Pressure or heat applied to a ceramic or cemented carbide tip is readily transferred to the tip affecting tip permeability and Hall output voltage. In addition, a hard cap rigidly adhered to a concentrator having different thermal expansion will be subject to varying stress with a change in temperature. Changing stress may change concentrator permeability resulting in Hall sensor output voltage and thickness measurement variation.

Similar issues have been experienced with existing replaceable, conformal plastic wear caps used to protect probe concentrator tip from wear. Those include a limited wear life, little protection from impact damage, needed adjustments to indicated thickness to compensate for plastic material lost progressively to wear. Plastic wear caps provide minimal increase in thermal resistance and pressure applied to the plastic is readily transferred to the tip affecting tip permeability and Hall output voltage.

Therefore the service life of Hall sensor probe assemblies for thickness measurement would be much improved with an exchangeable tip, provided that a range of challenges are addressed. One of the foremost is to make sure the exchangeable wear tip does not interfere with measurement accuracy in terms of its magnetic susceptibility and residual magnetization. Another challenge is to assure the exchangeable wear tip provides consistent tolerance, enduring incidences normal to regular field use, such as banging, pushing and occasionally dropping. A further challenge is to provide a measurement reference surface at a fixed distance from the concentrator tip. An ancillary challenge is to provide a reference surface at fixed distance from the tangent of a small concave surface. Yet a further requirement is to conserve measurement range greater than the test object thickness. An additional challenge is to oppose and withstand the measurement force without increasing the pressure on the concentrator tip. A supplemental challenge is to reduce temperature gradients within the probe by restricting heat flow between the probe and object being measured.

SUMMARY OF THE DISCLOSURE

Accordingly, it is a general objective of the present disclosure to provide a Hall sensor probe that embodies an exchangeable wear tip that offers long wear life, impact protection, thermal isolation and pressure relief with a defined shape and stable attachment to the main housing of the probe, and that is convenient and inexpensive to replace without compromising on measurement accuracy.

The Hall sensor probe herein presented in its best embodiment can be coupled with one of a plurality of magnetic targets for measuring the thickness of a non-ferromagnetic wall. The probe has a magnetic field sensor (also known as a Hall sensor), a magnetic field concentrator and a primary magnetic field source exerting a primary magnetic field and utilizes a plurality of replaceable tips. The wear tip, the sensor, concentrator, the primary magnetic source are concentrically assembled along the axis of the primary magnetic field; and, the tip is exchangeably affixed directly onto the main-housing, leaving a gap from and disjoined from the concentrator in a manner to transfer stress from the tip onto the main-housing. To serve every aspects of the primary objective, being it mechanical, thermal and operational, the material of the tip preferably has a fracture toughness higher than 20 MPa·m$^{1/2}$, a wear coefficient higher than 100, and a magnetic susceptibility lower than 0.001.

Many advantages of the probe built according to the teachings herein disclosed may be appreciated by those skilled in the art. The first is the use of the wear resistant, replaceable cap to prevent wear and accidental impact damage of the concentrator tip that could cause measurement inaccuracy, or require time consuming and expensive repair or replacement.

A second advantage is that it provides a precise reference contact surface contact while maintaining accurate measurement range greater than test object thickness.

A third advantage is that it provides a wear-tip with low residual magnetization by selecting paramagnetic or diamagnetic material with low magnetic susceptibility.

A fourth advantage of the invention is the use of a wear-tip to relieve stress on the concentrator that may cause the concentrator permeability and the measurement result to change.

A fifth advantage is that it provides a consistent air gap as a thermal barrier between the test object or environment and the concentrator to reduce heat flow and thermal gradients thereby reducing permeability gradients and decreasing measurement uncertainty.

It should be noted that some terms are inter-changeably used in the present disclosure, such as "probe" and "probe assembly"; "wear tip", "wear cap"; "magnets" and "magnetic source"; "target" and "target ball", or "ball". The usage of the terms do not limit the scope of the present disclosure.

BRIEF DESCRIPTION OF THE DRAWINGS

FIG. 3b is an 90° rotated profile view of the wear-tip of FIG. 3a.

Also noted is an exhibition Table-1 included in the present disclosure providing list of paramagnetic and diamagnetic materials showing desirable fracture toughness $K_{IC}$, hardness, modulus, wear coefficient $W_H$, magnetic permeability $\mu$, and absolute magnetic susceptibility $|\chi|$. The selection of an optimum material is describe by considering all these parameters.

DETAILED DESCRIPTION OF THE INVENTION

Figure 1:
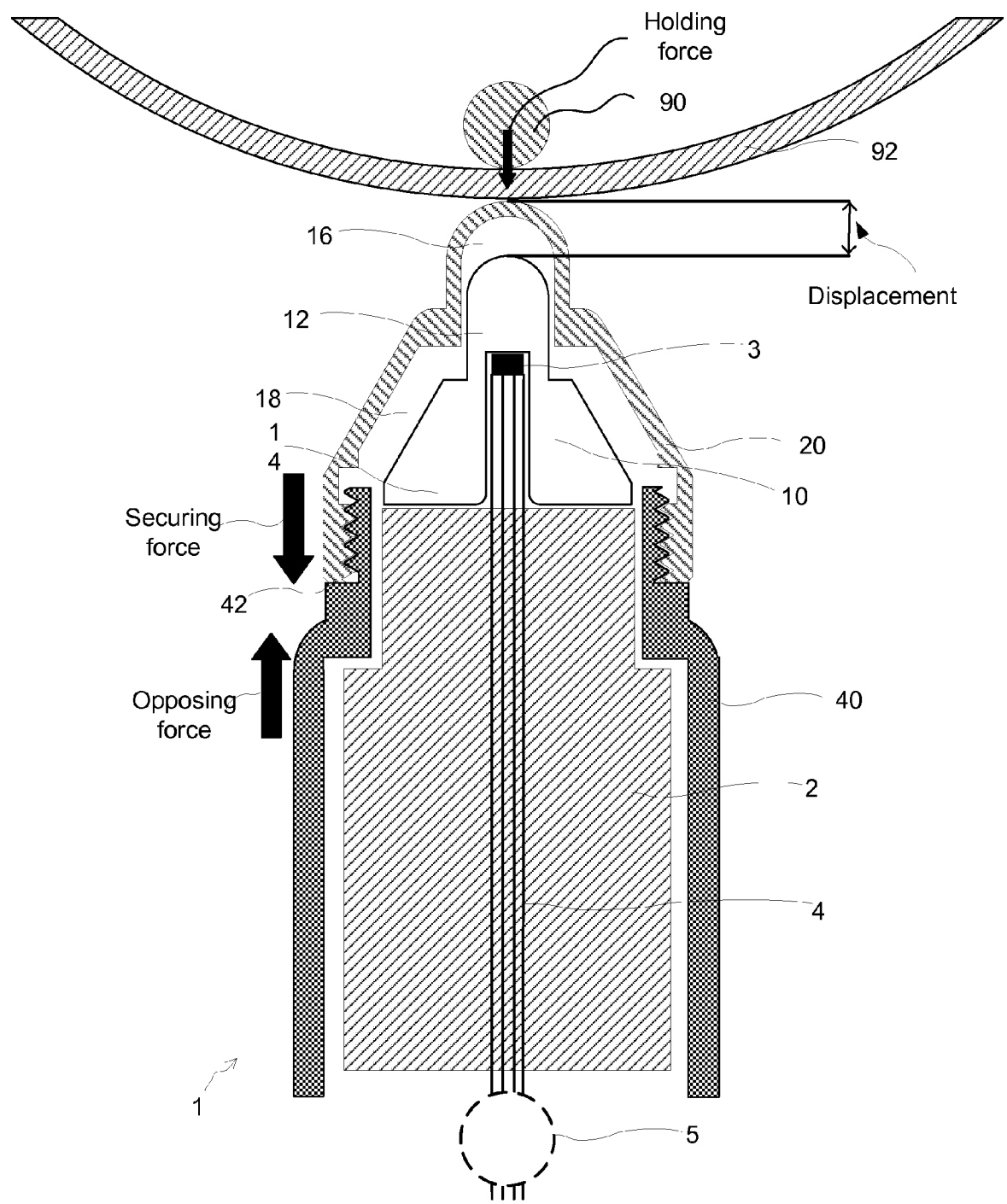
FIG. 1 is an axial cross-sectional view showing the assembly of the probe according to the presently disclosed best embodiment; wherein the wear-tip is attached to the main-housing in direct contact with the housing shoulder.

FIG. 1 shows a Hall effect probe 1 exerting a magnetic field (not shown) coupled with a magnetic target 90 for measuring the thickness of a thin wall 92 of a test object. As can be seen, during a measurement, probe 1 is placed against one side of wall 92 and target 90, with free range of movement on the other side of wall 92, is drawn to the surface of wall 92. The thickness of the wall is therefore the distance between the outer surface of target and the tip of probe 1.

The same as in existing practice, each probe can have a plurality of targets compatible and calibrated to work with each specific probe. Target(s) 90 is ferromagnetic, either being permanent with high coercivity or soft with very low remanence and is frequently in a sphere shape. It is therefore exchangeably called "target ball" in the present disclosure although other solid shapes may be used including but not limited to rods, disks, tapered disks, cylinders, ellipsoids and parallel prisms. An exemplary soft ferromagnetic target material is AISI 430 stainless steel.

Further shown in FIG. 1, probe 1 embodies a magnetic field sensor 3 connected by wires 4 to connector 5, a magnetic flux concentrator 10 adhesively bonded to a magnet 2 exerting a primary magnetic field (not shown). The magnetic source 2 typically consists of one or more permanent magnets with predetermined magnetic strength. Magnet 2 and, in some cases, some portion of concentrator 10 are enclosed by a main housing 40.

One of the novel aspects of the preferred embodiment of the probe includes a wear tip 20 that is exchangeably mounted on main probe housing 40. This is different from those tips of existing hall probes that are permanently or integrally fixed with the main housing of the Hall probes in existing products.

As shown in FIG. 1, wear tip 20, sensor 3, concentrator 10, and primary magnetic source 2 are concentrically assembled along the axis of the primary magnetic field. Wear tip 20 preferably encloses concentrator 10, the concentrator having a tip-end 12 housing sensor 3 and the concentrator also having a base-end 14 mounted to main housing 40 of the probe 1, which also houses the magnetic source 2.

It can be appreciated that, during field operations, the tip of the hall probe is often exerted with or exposed to factors of pressure, abrasion or impact when pushed and slid against the surface of the test object. It is therefore advantageous that in the preferred embodiment probe assembly 1 is designed with a gap between the inner surface of wear tip 20 and concentrator 10. As can be seen, wear tip 20 is attached to main housing 40 via a joint structure, e.g. screw, firmly abutting a shoulder 42 on housing 40, leaving gap or cavity in areas 16 and 18 in a manner so that wear tip 20 is disjoined, i.e., spaced from concentrator 10. This design represents another important novel aspect of the present invention that requires a rigid body of wear tip 20 and securing force resulting in the rigid structure of wear tip 20 and firm abutment of the wear-tip 20 with shoulder 42 on main housing 40. Any stress exerted by test object 92 onto wear tip 20 is withstood and countered by the opposing resistance of the shoulder 42 thereby preventing any stress acting upon concentrator 10 or further onto hall sensor 3.

It should be further appreciated that gap 16 or 18 also acts as a thermal barrier to reduce heat exchange between the exterior and interior of the probe 1 reducing thermal gradients in the concentrator 10 thereby reducing fluctuation in measurement accuracy.

Further referring to FIG. 1, the structural rigidness as part of the design featured in the present invention requires that the rigidness of wear tips meet a certain threshold. As a result, the novel aspects of the present invention further include the wear tips to be made of material having fracture toughness higher than 20 MPa·m$^{1/2}$, wear coefficient higher than 100, and a magnetic susceptibility lower than 0.001.

Figure 2:
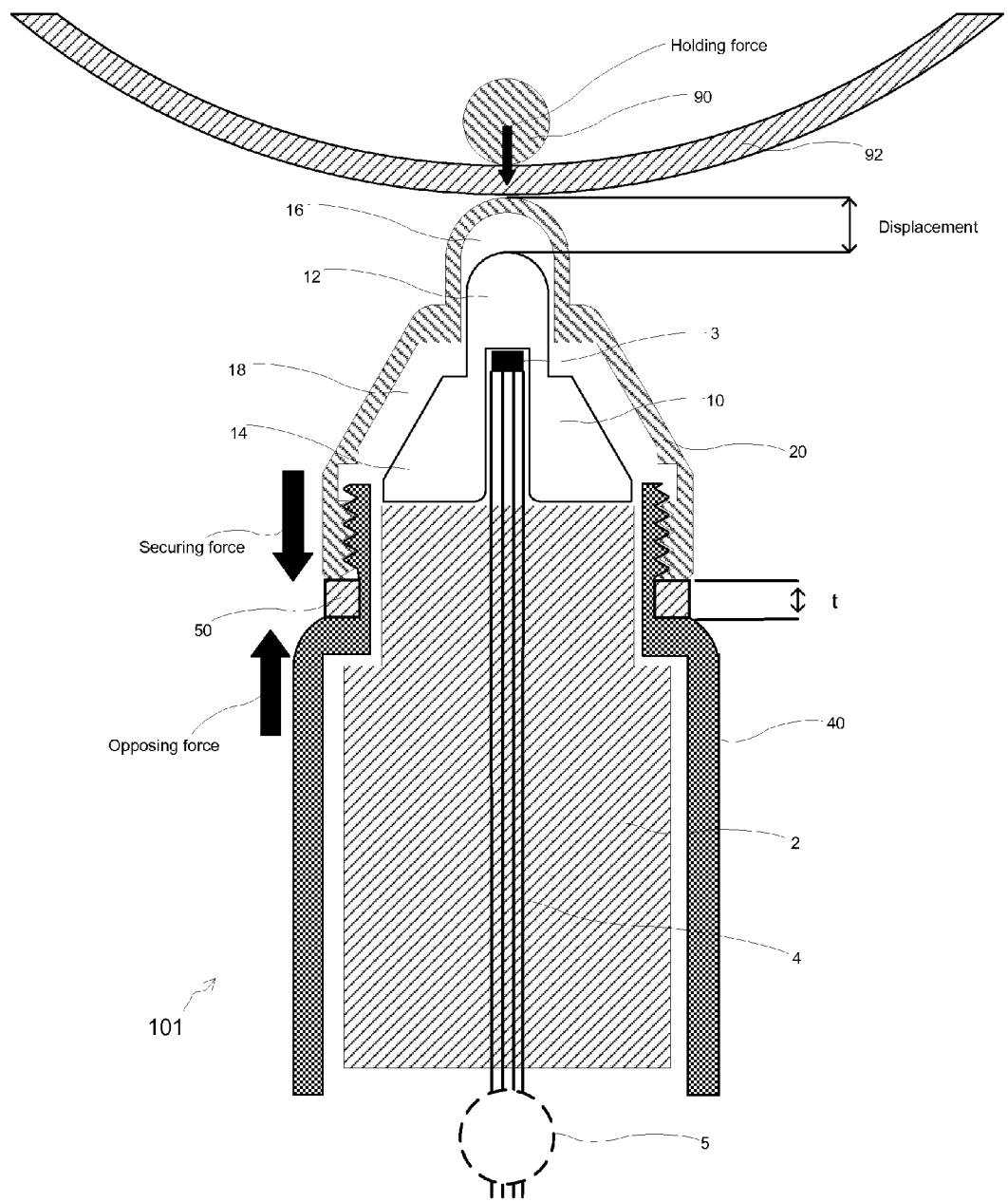
FIG. 2 is an axial cross-sectional view showing the assembly of the probe according to a presently disclosed alternative embodiment wherein the wear-tip is attached to the main-housing with an intermediate spacer or shim.

Reference now is made to FIG. 2, wherein an alternative embodiment of the exchangeable wear tip structure is presented. Description on FIG. 2 is focused the portion and aspects of the alternative embodiment that is different from the embodiment presented in FIG. 1 and should be herein construed in a complementary manner to the description associated with FIG. 1.

In comparison to the preferred embodiment shown in FIG. 1, a shim 50 is alternatively added between wear tip 20 and main housing 40. In this arrangement, wear-tip 20 is still exchangeably affixed directly onto the main-housing 40 via joint, such as screws, firmly abutting shim 50 on housing 40, leaving gaps 16 and 18 from concentrator 10. In this embodiment, wear tip 20 is also made permanently disjoined from the concentrator in a manner to transfer any stress from the wear-tip directly onto main-housing 40.

It is worth noting that, in this alternative embodiment, shim 50 can be advantageously exchangeable and used to form different desirable thicknesses t to control the displacement between tip end 12 of concentrator 10 and test object 92 to conserve task-specific desirable measurement range and assure maintaining optimum gaps 16 and 18.

Figure 3B:
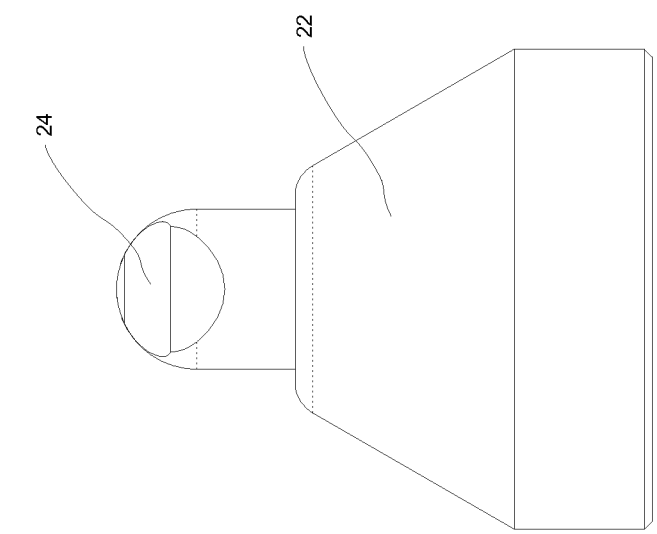
Figure 3A:
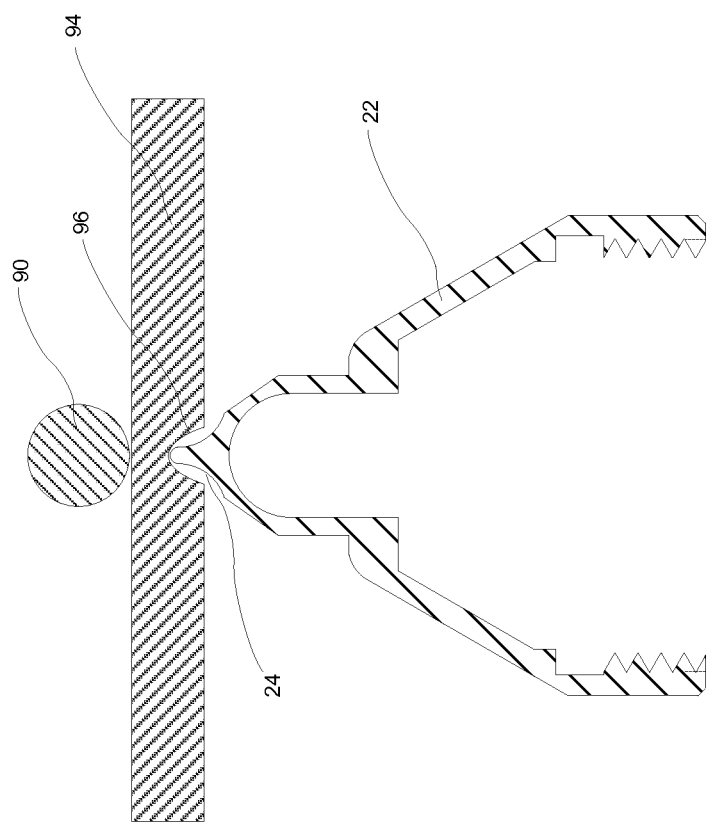
FIG. 3a is an axial cross-sectional view showing a wear-tip according to a presently disclosed embodiment; wherein the wear-tip is made of paramagnetic or diamagnetic material with high modulus and hardness and the tip is narrow shaped.

FIG. 3a is an axial cross-sectional view showing a wear-tip 22 according to an presently disclosed embodiment; wherein the wear-tip 22 is made of paramagnetic or diamagnetic material with high fracture toughness and wear coefficient; and, the tip 24 is narrow shaped. The narrow tip contacts the deepest surface of a recessed contour 96 in test object 94 providing a precise reference surface to accurately measure the distance to the target 90 at the thinnest portion of the test object.

FIG. 3b is a 90° rotated profile view of the wear-tip 22 of FIG. 3a.

Figure 4:
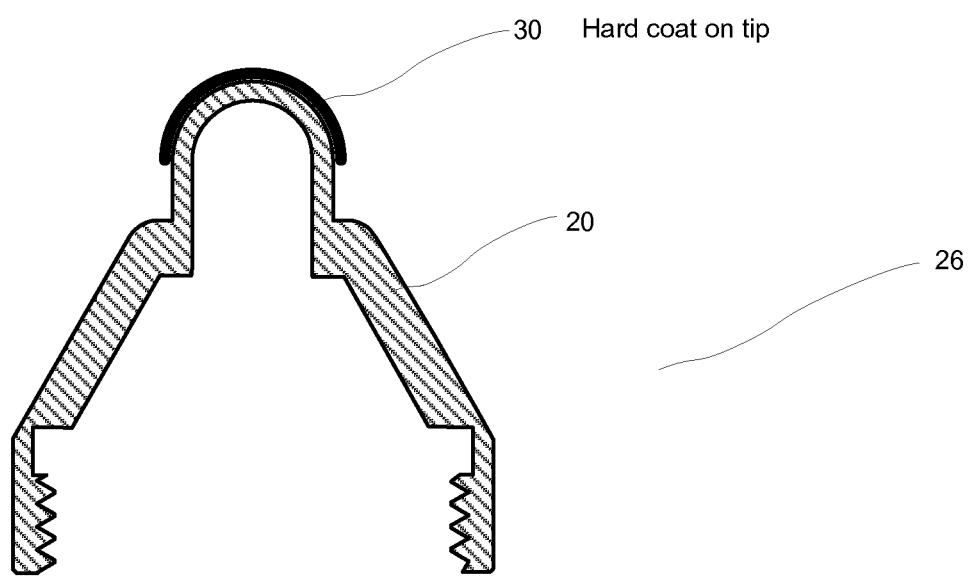
FIG. 4 is a cross-sectional view showing an alternative tip end design, in which the tip of the exchangeable tip is coated with wear-resistant material.

FIG. 4 is an axial cross-sectional view showing a coated wear-tip 26 according to a presently disclosed embodiment; wherein the wear-tip is made of paramagnetic or diamagnetic material with a wear resistant surface treatment or coating 30. The wear resistance of a wear tips can be improved by a plurality of surface treatments or coatings for example boride, nitride or carbide diffusion processes, or coating deposition by physical vapor deposition (PVD), chemical vapor deposition (CVD), plasma enhanced chemical vapor deposition (PECVD) among others, that harden surfaces and reduce wear while maintaining the fracture toughness of the underlying wear tip material.

Description of Material Selection for all Embodiments

As can be appreciated, there are many factors affecting the selection of the material of the exchangeable wear tips 20 and 22 so that the wear tip can optimally meet both mechanical or structural requirement and provide desirable magnetic qualities with minimum interference to measurement accuracy.

Figure 5:
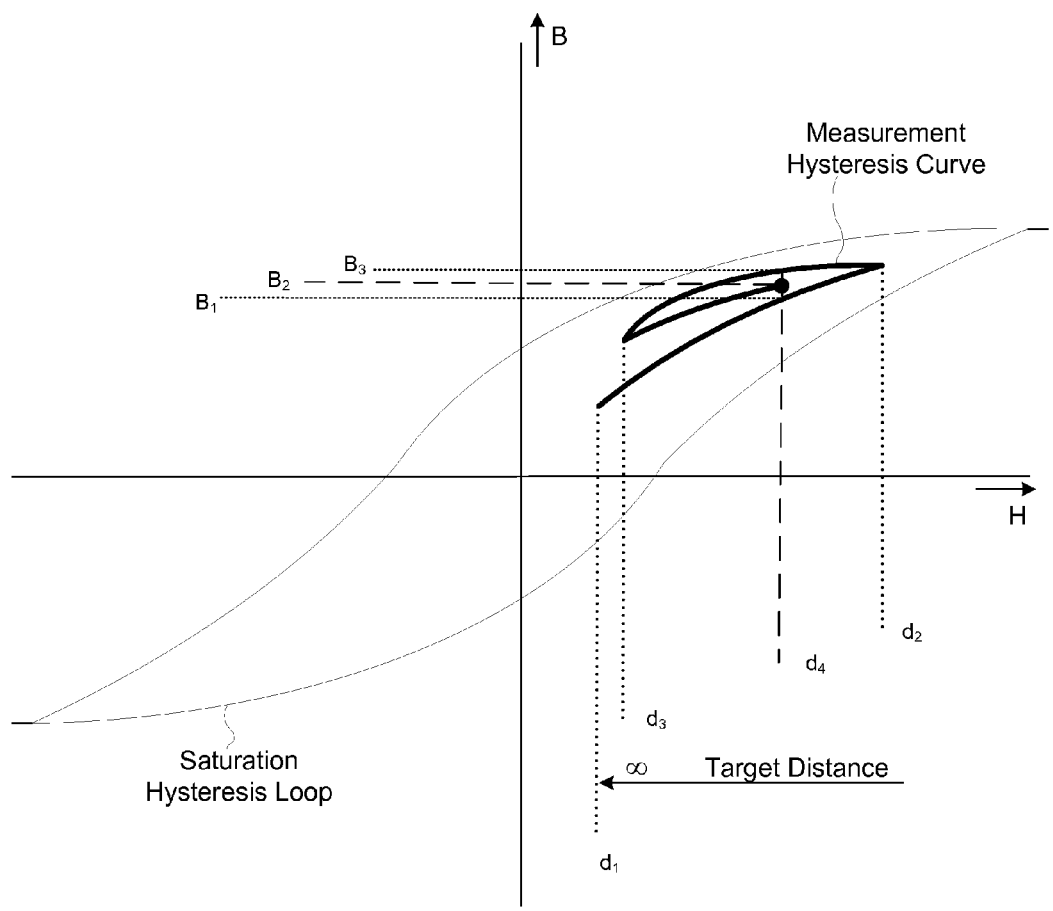
FIG. 5 is a plot of magnetic flux density B versus magnetic field H showing the saturation hysteresis loop for a wear tip material and a measurement hysteresis curve of possible B and H values within the loop for a target at varying distances.

Reference is now made to FIG. 5, which is a graph showing an observed hysteresis curve of magnetic flux density B versus magnetic field H during a thickness measurement and occurring within the boundary of the saturation hysteresis loop for a wear tip material. A good understanding of this relationship assists the selection of material which ideally exhibits the least amount of interference to measurement result as possible. The Hall sensor probe assembly senses small changes in magnetic flux density B to indicate test object thickness between infinite distance $d_1$, tip contact distance or zero distance $d_2$, and intermediate distances $d_3$, $d_4$, etc. The magnetic flux density B is determined by the strength of the magnetic field H as influenced by target position and also by the wear tip magnetization M as shown in Eq. 1

$$B = \mu_0 H + \mu_0 M, \qquad \text{Eq. 1}$$

where $\mu_0$ is a physical constant, the magnetic permeability of a vacuum. For diamagnetic and paramagnetic materials at a given temperature, the magnetization can be written as $$M = \chi_m H, \qquad \text{Eq. 2}$$

where $\chi_m$ is a dimensionless quantity called the magnetic susceptibility of the material. Substituting Eq. 2 in to Eq 1. yields:

$$B=\mu_0 H(1+\chi^m),\qquad \text{Eq. 3}$$

where the parenthetical term is the relative permeability $\mu_r$ of the material. Referring to FIG. 5, the solid curve within the loop shows possible B and H values for a target taken from a great distance shown on the plot by d1 and continuously moved closer to the probe through position d4 to position d2. The target motion is then reversed moving from d2 through d4 to position d3 where motion is again reversed and then stopped at d4. A sequence of motions such as that shown in FIG. 5 is typically encountered when measuring test object wall thickness. Three distinct magnetic flux density values $B_1$, $B_2$, and $B_3$ are apparent in the plot for distance d4 due to the residual magnetization ΔM of the wear tip material. The different flux density values due to residual magnetization in a wear tip affect thickness measurement accuracy. The intensity of magnetic remanence is generally correlated with magnetic susceptibility $\chi_m$ and minimizing wear tip (absolute) susceptibility $|\chi_m|$ minimizes measurement errors. As $|\chi_m|$ approaches zero, Eq. 3 reduces to desirable result $$B=\mu_0 H.\qquad \text{Eq. 4}$$

Therefore, guided by the above observation, absolute susceptibility $|\chi_m|$ is one of the most important qualities considered in material selection. Next, the selection process of the presently disclosed method goes on to include material properties that makes wear tip 20 meet the following requirements for material property:

Structurally rigid enough to withstand the pressure exerted during measurement operations;

Wear-resistant for prolonged usage, withstanding abrasions exerted during measurement;

Reference now is made to the following Table-1, showing materials exhibiting a range of acceptable absolute susceptibility $|\chi_m|$ and their other associated mechanical properties. Choices can be made with the optimum combination of these properties.

articles which discuss their relationship can be found in literature, for example, in N. Dubrovinskaia, S. Dub, and L. Dubrovinsky, *Nano Letters* 2006, 6, 824-826. One empirical relationship given in the cited Reference as shown below:

$$W_H = \frac{\sqrt{K_{1C}} \cdot H_K^{1.43}}{E^{0.8}} \qquad \text{Eq. 5}$$

where, $K_{1c}$: Fracture Toughness (MPa·m$^{1/2}$)

$H_K$: Knoop Hardness (GPa)

E: Young's Modulus (GPa)

$W_H$ Wear Coefficient

This relationship can be used to estimate and compare the wear resistance of the materials. According to this empirical formulation, the wear resistance increases with increasing fracture toughness and hardness and decreasing Young's modulus. However, it should be noted that hard materials generally have lower fracture toughness and these properties have to be optimized in order to provide both good wear life of the wear tip and impact protection to the Hall sensor probe. Wear characteristics suitable for the test object to be inspected should be selected for exchangeable wear tips.

Therefore, considering the materials available today, a fracture toughness higher than 20 MPa·m$^{1/2}$, and wear coefficient higher than 100 is sufficient for many applications such as blow molded plastic bottles and automobile air bag tear seam inspection. A fracture toughness higher than 50 MPa·m$^{1/2}$, and wear coefficient higher than 700 is preferred for many inspections of hard, abrasive materials such as titanium forgings and fiberglass layups.

Therefore some exemplary materials considered to be good fit for the wear-tips include titanium, aluminum and beryllium-copper. The choices should be made considering particular testing conditions to be suited for, the cost and availability of the materials.

TABLE 1

Factors Affecting Material Selection

| Material type | Material | $K_{Ic}$ (MPa·m$^{1/2}$) | Knoop hardness | Young's modulus GPa | $W_H$ | $\mu_r$ | $|\chi_m|$ |
|---|---|---|---|---|---|---|---|
| Titanium alloy | Ti-6AL-4V | 75 | 363 | 113.8 | 898 | 1.00018 | 0.00018 |
| Aluminum alloy | aluminum 6061-t6 | 29 | 120 | 68.9 | 171 | 1.00058 | 0.00058 |
| BeCu | brush alloy 25 C17200 | 110 | 454 | 138 | 1283 | 1.00060 | 0.00060 |
| Austenitic stainless | 304 (cold reduction 0-70%) | 258 | 186 | 193 | 418 | 1.005-1.9 | .005-.9 |
| Austenitic stainless | AISI 303 | 258 | 175 | 193 | 384 | 1.01-1.1 | .01-0.1 |
| Austenitic stainless | AISI 316 | 225 | 168 | 193.06 | 339 | 1.005-1.01 | .005-.01 |
| cemented carbide | WC—Co | 14 | 1865 | 590 | 274 | 1.01-10 | 0.01 |
| carbide | SiC | 2.5 | 1900 | 410 | 376 | 0.99950 | 0.00050 |
| plastic | Ultem 2100 | 2 | 16.8 | 3.3096 | 24 | 1.00001 | 0.00001 |
| plastic | Polystyrene | 0.7-1.1 | 12 | 3.5 | 12 | 0.99999 | 0.00001 |

Table-1 lists example paramagnetic and diamagnetic materials showing relative magnetic permeability $\mu_r$, and absolute magnetic susceptibility $|\chi_m|$. The absolute susceptibility of wear tip materials for Hall sensor probes should be less than 0.01, preferably less than 0.001.

The material properties that directly contribute to the wear and impact resistance for any given material are listed in Table-1 fracture toughness $K_{1c}$, hardness, modulus, and wear coefficient $W_H$. Although there is not a standard conclusive empirical formula between these properties, many scientific In a preferred embodiment Ti-6Al-4v titanium alloy material combines very low susceptibility with high fracture toughness, modulus and wear resistance for a general purpose, exchangeable wear tip.

As described above, the present disclosure if directed to several inventions, including: a Hall sensor probe configured to be coupled with one of a plurality of Hall sensor targets for measuring the thickness of a non-ferromagnetic wall. The Hall sensor probe comprises: a magnetic field sensor, a magnetic field concentrator and a primary magnetic field source for providing a primary magnetic field along an axis; a main housing enclosing at least a major portion of the magnetic field source; and a replaceable wear tip enclosing at least a major portion of a tip-end of the concentrator, leaving a gap; wherein the replaceable wear tip, the sensor, concentrator, the primary magnetic source and the main housing are concentrically assembled along the axis of the primary magnetic field; and, wherein the replaceable wear tip is exchangeably affixed onto the main-housing, and the replaceable wear tip is made of material having a fracture toughness higher than 20 MPa·m$^{1/2}$, wear coefficient higher than 100, and a magnetic susceptibility lower than 0.01, wherein the wear tip affixed onto the main-housing is a working tip of the probe.

Preferably, one of the Hall sensor targets is a working target being placed on the other side of the non ferromagnetic wall, opposite from the working tip of the probe; and a connecting line between the working target and the working tip of the probe is aligned with the axis of the primary magnetic source during a testing condition. Preferably, the working target exerts a secondary magnetic field wherein an axis of the secondary magnetic field is aligned with the axis of the primary magnetic field during the testing condition. Preferably, the plurality of targets are hard permanent magnetic targets. Preferably, the at least one of the Hall sensor targets has a shape selected from a group consisting of disks, cylinders, wires, rods, prisms and ellipsoids. Preferably, the concentrator is made of a rigid metal shell structure. Preferably, a size of the gap between the concentrator and the replaceable wear tip is adjustable. Preferably, the probe further includes one of a plurality of selectable spacers, each of which can be placed between the working tip and the main housing so that the gap between the working wear tip and the concentrator is adjustable. Preferably, the concentrator is secured onto the magnetic field source. Preferably, the wear-tip is configured with a sharper tip on top of the wear-tip, in such a fashion so the wear-tip can be fitted to measure the thickness of walls with small indentations. Preferably, the probe includes a plurality of additional wear-tips, each of which is configured to be fitted to the probe.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A Hall sensor probe configured to be coupled with one of a plurality of Hall sensor targets for measuring the thickness of a non-ferromagnetic wall, comprising, a magnetic field sensor, a magnetic field concentrator and a primary magnetic field source for providing a primary magnetic field along an axis;
a main housing enclosing at least a major portion of the magnetic field source; and a replaceable wear tip enclosing at least a major portion of a tip-end of the concentrator, leaving a gap;
wherein the replaceable wear tip, the sensor, concentrator, the primary magnetic field source and the main housing are concentrically assembled along the axis of the primary magnetic field;
and, wherein the replaceable wear tip is exchangeably affixed onto the main-housing, and the replaceable wear tip is made of material having a fracture toughness higher than 20 MPa—in wear coefficient higher than 100, and a magnetic susceptibility lower than 0.01.

2. The Hall sensor probe of claim 1, wherein the replaceable wear tip affixed onto the main-housing is a working tip of the Hall sensor probe.

3. The Hall sensor probe of claim 2, wherein one of the Hall sensor targets is a working target being placed on the other side of the non ferromagnetic wall, opposite from the working tip of the Hall sensor probe; and,
a connecting line between the working target and the working tip of the Hall sensor probe is aligned with the axis of the primary magnetic source during a testing condition.

4. The Hall sensor probe of claim 3, wherein the working target exerts a secondary magnetic field wherein an axis of the secondary magnetic field is aligned with the axis of the primary magnetic field during the testing condition.

5. The Hall sensor probe of claim 2, wherein the plurality of targets are hard permanent magnetic targets.

6. The Hall sensor probe of claim 2, wherein the plurality of Hall sensor targets are soft ferromagnetic targets.

7. The Hall sensor probe of claim 2, wherein the concentrator is made of a rigid metal shell structure.

8. The Hall sensor probe of claim 2, wherein a size of the gap between the concentrator and the replaceable wear tip is adjustable.

9. The Hall sensor probe of claim 2, wherein the working tip of the Hall sensor probe is attached onto the main housing via a screw type joint.

10. The Hall sensor probe of claim 9, wherein the concentrator is secured onto the primary magnetic field source.

11. The Hall sensor probe of claim 2, wherein the Hall sensor probe further includes one of a plurality of selectable spacers, each of which can be placed between the working tip of the Hall sensor probe and the main housing so that the gap between the working tip of the Hall sensor probe and the concentrator is adjustable.

12. The Hall sensor probe of claim 11, wherein the concentrator is secured onto the primary magnetic field source via adhesive material.

13. The Hall sensor probe of claim 2, wherein the primary magnetic field source is formed by one or more permanent magnets.

14. The Hall sensor probe of claim 1, wherein at least one of the Hall sensor targets has a shape selected from a group consisting of disks, cylinders, wires, rods, prisms and ellipsoids.

15. The Hall sensor probe of claim 1, wherein the one of the plurality of Hall sensor targets is made at least partially of AISI 430 stainless steel.

16. The Hall sensor probe of claim 1, wherein an outward-side of the replaceable wear tip is coated with wear-resistance material.

17. The Hall sensor probe of claim 1, wherein the replaceable wear tip is configured with a sharper tip on top of the replaceable wear tip, in such a fashion so the replaceable wear tip can be fitted to measure the thickness of walls with small indentations.

18. The Hall sensor probe of claim 1, where in the replaceable wear tip is made of material having less than 0.001 in an absolute magnetic susceptibility.

19. The Hall sensor probe of claim 1, wherein the replaceable wear tip is made of material exhibiting low magnetic susceptibility, high fracture toughness, hardness, modulus, and/or wear coefficient.

20. The Hall sensor probe of claim 1, wherein the replaceable wear tip is a material selected from the group consisting of titanium, aluminum and beryllium-copper.

21. The Hall sensor probe of claim 1, including a plurality of additional replaceable wear tips, each of which is configured to be fitted to the Hall sensor probe.

* * * * *